United States Patent
Wu

(10) Patent No.: US 10,847,218 B2
(45) Date of Patent: Nov. 24, 2020

(54) BAND-GAP REFERENCE START-UP CIRCUIT WITH GREATER NOISE MARGIN FOR START-UP

(71) Applicant: eMemory Technology Inc., Hsin-Chu (TW)

(72) Inventor: Chien-Han Wu, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 16/563,959

(22) Filed: Sep. 9, 2019

(65) Prior Publication Data

US 2020/0159271 A1  May 21, 2020

Related U.S. Application Data

(60) Provisional application No. 62/768,099, filed on Nov. 16, 2018.

(51) Int. Cl.
*G05F 3/22* (2006.01)
*G11C 11/56* (2006.01)
(Continued)

(52) U.S. Cl.
CPC ............ *G11C 11/5642* (2013.01); *G05F 3/22* (2013.01); *G05F 3/30* (2013.01); *G11C 5/147* (2013.01);
(Continued)

(58) Field of Classification Search
CPC ..... G05F 3/02; G05F 3/16; G05F 3/22; G05F 3/26; G05F 3/30; G05F 3/262; G05F 3/265; G05F 3/267; G11C 5/147; G11C 11/5642; G11C 16/0408; G11C 16/0433; G11C 16/08; G11C 16/10; G11C 16/14; G11C 16/24; G11C 16/26; G11C 16/28;
(Continued)

(56) References Cited

U.S. PATENT DOCUMENTS 5,867,013 A * 2/1999 Yu .............................. G05F 3/30
                                                              323/314
6,201,435 B1 * 3/2001 Chou ....................... G05F 3/262
                                                              323/315
(Continued)

FOREIGN PATENT DOCUMENTS

TW    201039090 A1   11/2010
TW    201239574 A1   10/2012

*Primary Examiner* — Yemane Mehari
(74) *Attorney, Agent, or Firm* — Winston Hsu

(57) ABSTRACT

A band-gap reference start-up circuit includes a pull-up unit, a bias current unit, and a start-up unit. The pull-up unit and the bias current unit are coupled to a control node. The start-up unit is coupled to a trigger terminal of the band-gap voltage reference circuit and the control node. During a start-up process of the band-gap voltage reference circuit, the bias current unit is enabled to generate a bias current for pulling down a voltage of the control node, the start-up unit is enabled to generate a start-up current for raising a voltage of the trigger terminal to enable the band-gap voltage reference circuit when the voltage of the control node is pulled down by the bias circuit unit, and the pull-up unit is enabled to generate the pull-up current for raising the voltage of the control node when the band-gap voltage reference circuit is enabled.

20 Claims, 4 Drawing Sheets

(51) Int. Cl.
*G11C 5/14* (2006.01)
*G11C 16/30* (2006.01)
*G11C 16/24* (2006.01)
*G11C 16/28* (2006.01)
*G11C 16/08* (2006.01)
*G11C 16/04* (2006.01)
*G11C 16/10* (2006.01)
*G11C 16/26* (2006.01)
*G11C 16/34* (2006.01)
*G05F 3/30* (2006.01)
*G11C 16/14* (2006.01)
*H01L 27/02* (2006.01)
*H01L 27/11524* (2017.01)

(52) U.S. Cl.
CPC ...... *G11C 16/0408* (2013.01); *G11C 16/0433* (2013.01); *G11C 16/08* (2013.01); *G11C 16/10* (2013.01); *G11C 16/14* (2013.01); *G11C 16/24* (2013.01); *G11C 16/26* (2013.01); *G11C 16/28* (2013.01); *G11C 16/30* (2013.01); *G11C 16/3445* (2013.01); *G11C 16/3459* (2013.01); *H01L 27/0207* (2013.01); *H01L 27/11524* (2013.01)

(58) Field of Classification Search
CPC . G11C 16/30; G11C 16/3445; G11C 16/3459; H01L 27/0207; H01L 27/11524
USPC .................................................. 323/311–317
See application file for complete search history.

(56) References Cited

U.S. PATENT DOCUMENTS

| | | | |
|---|---|---|---|
| 6,259,240 B1* | 7/2001 | Smith | G05F 1/468 323/313 |
| 6,906,581 B2 | 6/2005 | Kang | |
| 7,679,352 B2* | 3/2010 | Peng | G05F 3/30 323/313 |
| 9,710,010 B2 | 7/2017 | Shen | |
| 2003/0080806 A1 | 5/2003 | Sugimura | |
| 2007/0164722 A1* | 7/2007 | Rao | G05F 3/262 323/315 |
| 2008/0231248 A1* | 9/2008 | Hung | G05F 3/30 323/313 |
| 2010/0164466 A1* | 7/2010 | Jo | G05F 3/30 323/313 |
| 2010/0164467 A1* | 7/2010 | Jo | G05F 3/30 323/313 |
| 2011/0006749 A1* | 1/2011 | Stellberger | G05F 3/30 323/313 |
| 2014/0232453 A1* | 8/2014 | Choi | G05F 3/16 327/539 |

\* cited by examiner

BAND-GAP REFERENCE START-UP CIRCUIT WITH GREATER NOISE MARGIN FOR START-UP

CROSS REFERENCE TO RELATED APPLICATIONS

This non-provisional application claims priority of U.S. provisional application No. 62/768,099, filed on Nov. 16, 2018, included herein by reference in its entirety.

BACKGROUND OF THE INVENTION

1. Field of the Invention

The present invention is related to a band-gap reference start-up circuit, and more particularly, to a band-gap reference start-up circuit with a greater noise margin for start-up.

2. Description of the Prior Art

A band-gap voltage reference circuit is widely used in integrated circuits for producing a fixed voltage regardless of power supply variations, temperature changes and circuit loading from a device. The fixed voltage can be used as a reference voltage by charge pumps for providing other high voltages required by the system. Therefore, the stability of the band-gap reference voltage can be crucial to the system.

In prior art, the start-up process of the band-gap voltage reference circuit is triggered by voltage detection. That is, when the power is turned on, if the reference voltage generated by the band-gap voltage reference circuit is not high enough, the start-up process will be triggered. However, the noise margin for the start-up of the band-gap voltage reference circuit is rather small and is greatly dependent on the manufacturing process of the components. Therefore, when the supply voltage is unstable, the transient of the band-gap reference voltage can cause a restart-up of the band-gap voltage reference circuit easily, resulting in instability or damages to the system.

SUMMARY OF THE INVENTION

One embodiment of the present invention discloses a band-gap reference start-up circuit. The band-gap reference start-up circuit includes a pull-up unit, a bias current unit, and a start-up unit.

The pull-up unit is coupled to a control node, and generates a pull-up current for raising a voltage of the control node when the band-gap voltage reference circuit is enabled and generates a biasing reference voltage. The bias current unit is coupled to the control node, and generates a bias current for pulling down the voltage of the control node. The start-up unit is coupled to a trigger terminal of the band-gap voltage reference circuit and the control node. The start-up unit generates a start-up current for raising a voltage of the trigger terminal.

During a start-up process of the band-gap voltage reference circuit, the start-up unit is enabled when the voltage of the control node is pulled down by the bias current unit, and the band-gap voltage reference circuit is enabled when the voltage of the trigger terminal is raised by the start-up current.

Another embodiment of the present invention discloses a voltage reference generator. The voltage reference generator includes a band-gap voltage reference circuit and a band-gap reference start-up circuit.

The band-gap voltage reference circuit provides a band-gap reference voltage. The band-gap reference start-up circuit includes a pull-up unit, a bias current unit, and a start-up unit.

The pull-up unit is coupled to a control node, and generates a pull-up current for raising a voltage of the control node when the band-gap voltage reference circuit is enabled and generates a biasing reference voltage. The bias current unit is coupled to the control node, and generates a bias current for pulling down the voltage of the control node. The start-up unit is coupled to a trigger terminal of the band-gap voltage reference circuit and the control node. The start-up unit generates a start-up current for raising a voltage of the trigger terminal.

During a start-up process of the band-gap voltage reference circuit, the start-up unit is enabled when the voltage of the control node is pulled down by the bias current unit, and the band-gap voltage reference circuit is enabled when the voltage of the trigger terminal is raised by the start-up current.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
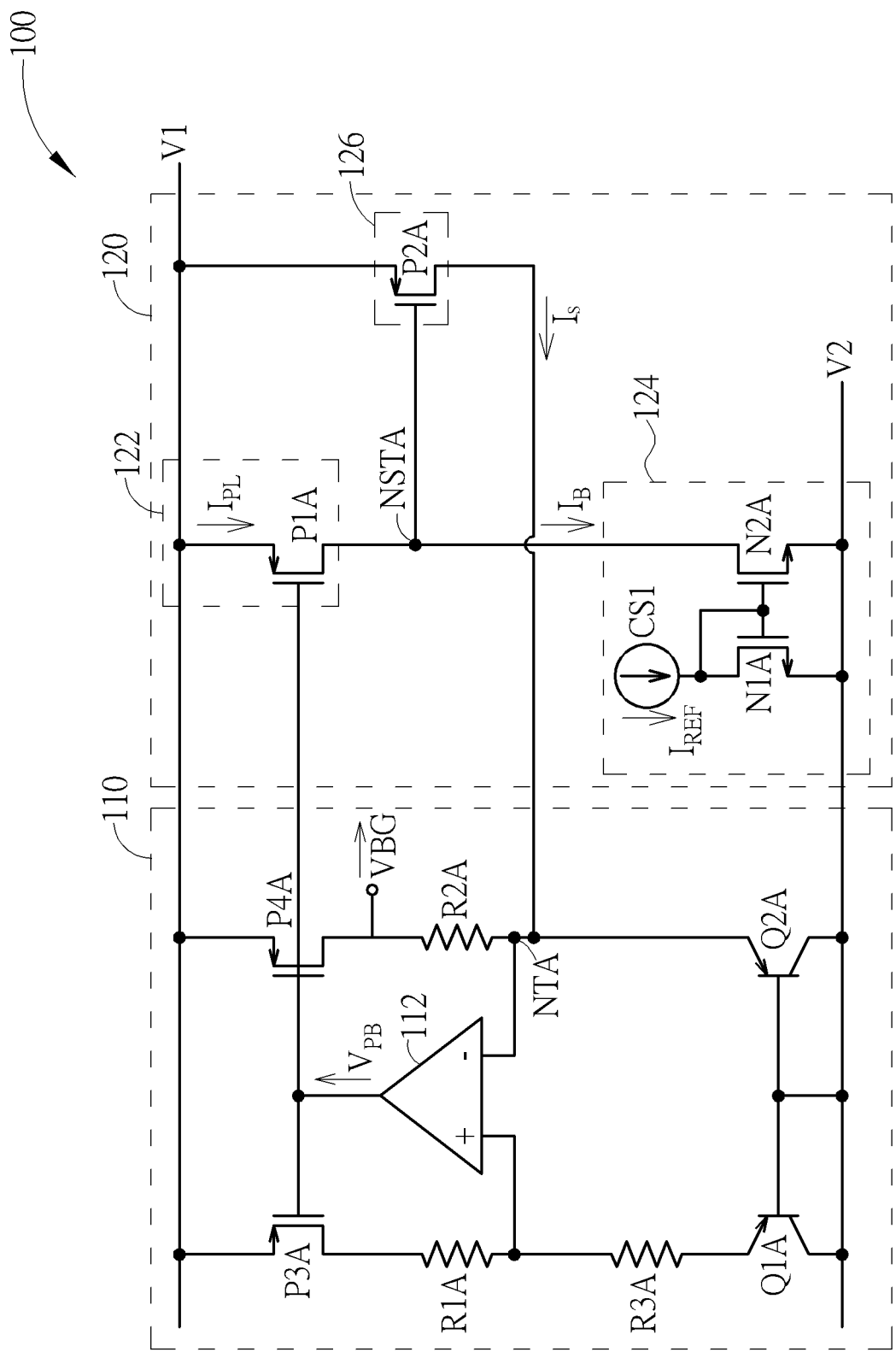
FIG. 1 shows a voltage reference generator according to one embodiment of the present invention.

FIG. 1 shows a voltage reference generator 100 according to one embodiment of the present invention. The voltage reference generator 100 includes a band-gap voltage reference circuit 110 and a band-gap reference start-up circuit 120.

The band-gap voltage reference circuit 110 can provide a band-gap reference voltage VBG as a reference voltage for the system. In some embodiments, the band-gap reference voltage VBG can be 1.15V to 1.25V. The band-gap reference start-up circuit 120 can be used to enable the band-gap voltage reference circuit 110 when the power is turned on.

The band-gap reference start-up circuit 120 includes a pull-up unit 122, a bias current unit 124, and a start-up unit 126. The pull-up unit 122 and the bias current unit 124 can be coupled to a control node NSTA, and the start-up unit 126 can be coupled to a trigger terminal NTA of the band-gap voltage reference circuit 110 and the control node NSTA.

During the start-up process of the band-gap voltage reference circuit 110, the bias current unit 124 will be enabled first to generate the bias current $I_B$, pulling down the voltage of the control node NSTA. When the voltage of the control node NSTA is pulled down by the bias current unit 124, for example, when the voltage is pulled down to be lower than a threshold value, the start-up unit 126 will be enabled to generate a start-up current $I_S$ for raising a voltage of the trigger terminal NTA. The band-gap voltage reference circuit 110 is then enabled when the voltage of the trigger terminal NTA is raised by the start-up current $I_S$.

Once the band-gap voltage reference circuit 110 is enabled to produce the band-gap reference voltage VBG, the reference voltage $V_{PB}$ of the band-gap voltage reference circuit 110 will drop, thereby enabling the pull-up unit 122 to generate the pull-up current $I_{PL}$ and raising the voltage of the control node NSTA. In some embodiments, the pull-up current $I_{PL}$ is greater than the bias current $I_B$. Therefore, the voltage of the control node NSTA will be raised by the pull-up current $I_{PL}$ eventually, and the start-up unit 126 will be disabled.

In this case, since the band-gap reference start-up circuit 120 can perform the start-up process by controlling different currents, the noise margin for the start-up process can be broadened, thereby improving the stability of the voltage reference generator 100.

In FIG. 1, the pull-up unit 122 includes a P-type transistor P1A having a first terminal for receive a first system voltage V1, a second terminal coupled to the control node NSTA, and a control terminal for receiving the biasing reference voltage $V_{PB}$. The bias current unit 124 includes a current source CS1, and N-type transistors N1A and N2A. The current source CS1 can generate a reference current $I_{REF}$. The first N-type transistor N1A has a first terminal for receiving the reference current $I_{REF}$, a second terminal for receiving a second system voltage V2 lower than the first system voltage V1, and a control terminal coupled to the first terminal of the N-type transistor N1A. In some embodiments, the first system voltage V1 can be the high operation voltage of the system, and the second system voltage V2 can be the ground voltage of the system. The N-type transistor N2A has a first terminal coupled to the control node NSTA, a second terminal for receiving the second system voltage V2, and a control terminal coupled to the control terminal of the N-type transistor N1A. That is, the N-type transistors N1A and N2A can form a current mirror and produce the bias current $I_B$ according to the reference current $I_{REF}$.

In addition, the start-up unit 126 includes a P-type transistor P2A having a first terminal for receiving the first system voltage V1, a second terminal coupled to the trigger terminal NTA of the band-gap voltage reference circuit 110, and a control terminal coupled to the control node NSTA.

Furthermore, in FIG. 1, the band-gap voltage reference circuit 110 includes an amplifier 112, P-type transistors P3A and P4A, resistors R1A, R2A and R3A, and diode-connected bipolar junction transistors (BJTs) Q1A and Q2A.

The amplifier 112 has a positive input terminal, a negative input terminal coupled to the trigger terminal NTA of the band-gap voltage reference circuit 110, and an output terminal for providing the biasing reference voltage $V_{PB}$. The P-type transistor P3A has a first terminal for receiving the first system voltage V1, a second terminal, and a control terminal coupled to the output terminal of the amplifier 112. The P-type transistor P4A has a first terminal for receiving the first system voltage V1, a second terminal for outputting the band-gap reference voltage VBG, and a control terminal coupled to the control terminal of the P-type transistor P3A.

The resistor R1A has a first terminal coupled to the second terminal of the P-type transistor P3A, and a second terminal coupled to the positive input terminal of the amplifier 112. The resistor R2A has a first terminal coupled to the second terminal of the P-type transistor P4A, and a second terminal coupled to the negative input terminal of the amplifier 112. The resistor R3A has a first terminal coupled to the second terminal of the resistor R1A, and a second terminal.

The diode-connected BJT Q1A has a first terminal coupled to the second terminal of the resistor R3A, and a second terminal for receiving the second system voltage V2. The diode-connected BJT Q2A has a first terminal coupled to the trigger terminal NTA, and a second terminal for receiving the second system voltage V2. In some embodiments, the size of the diode-connected BJT Q1A can be greater than the size of the diode-connected BJT Q2A, or the band-gap voltage reference circuit 110 can include more diode-connected BJTs coupled in parallel with the diode-connected BJT Q1A.

In FIG. 1, the diode-connected BJTs Q1A and Q2A can be PNP bipolar junction transistors. In this case, the control terminals (base terminals) of the diode-connected BJTs Q1A and Q2A can both receive the second system voltage V2. However, in some other embodiments, the diode-connected BJTs Q1A and Q2A can also be NPN bipolar junction transistors. In this case, the control terminal of the diode-connected BJT Q1A would be coupled to the first terminal of the diode-connected BJT Q1A, and the control terminal of the diode-connected BJT Q2A can be coupled to the first terminal of the diode-connected BJT Q2A.

In FIG. 1, when the power is turned on, if the band-gap voltage reference circuit 110 has not been enabled, then biasing reference voltage $V_{PB}$ generated by the amplifier 112 should be at a high voltage, turning off the P-type transistors P1A, P3A, and P4A. That is, the pull-up unit 122 is also disabled. However, the bias current unit 124 will start to generate the bias current $I_B$ when power up, thereby pulling down the voltage of the control node NSTA.

When the voltage of the control node NSTA is pulled to a rather low level, the P-type transistor P2A in the start-up unit 126 will be turned on. Therefore, the start-up unit 126 will generate the start-up current $I_S$ to charge the trigger terminal NTA of the band-gap voltage reference circuit 110. Since the trigger terminal NTA is coupled to the negative input terminal of the amplifier 112, the biasing reference voltage $V_{PB}$ will drop when the voltage of the trigger terminal NTA increases. When the biasing reference voltage $V_{PB}$ is pulled down to a rather low level, the P-type transistors P3A and P4A will both be turned on, and the band-gap voltage reference circuit 110 is enabled to generate the band-gap reference voltage VBG.

In prior art, the trigger terminal may be coupled to output terminal of the amplifier 112, so the triggering voltage can cause great transient to the band-gap reference voltage VBG during the start-up process.

However, in the voltage reference generator 100, the trigger terminal NTA is coupled to the negative input terminal of the amplifier 112; therefore, the overshoot of the band-gap reference voltage VBG can be reduced.

Also, the P-type transistor P1A in the pull-up unit 122 will also be turned on when the P-type transistors P3A and P4A are turned on by the biasing reference voltage $V_{PB}$. Therefore, when the band-gap voltage reference circuit 110 is enabled, the pull-up unit 122 will start to generate the pull-up current $I_{PL}$. Since the pull-up current $I_{PL}$ can be designed to be greater than the bias current $I_B$, the voltage of the control node NSTA will be raised by the pull-up current $I_{PL}$, thereby turning off the P-type transistors P2A in the start-up unit 126. Consequently, the start-up process is completed, and the band-gap voltage reference circuit 110 can generate the band-gap reference voltage VBG accordingly.

In FIG. 1, the band-gap voltage reference circuit 110 can provide the band-gap reference voltage VBG with the desired level by selecting the proper resistors and transistors. However, in some other embodiments, the band-gap voltage reference circuit can be implemented with other structures, and the band-gap reference start-up circuit 120 can still be applied.

Figure 2:
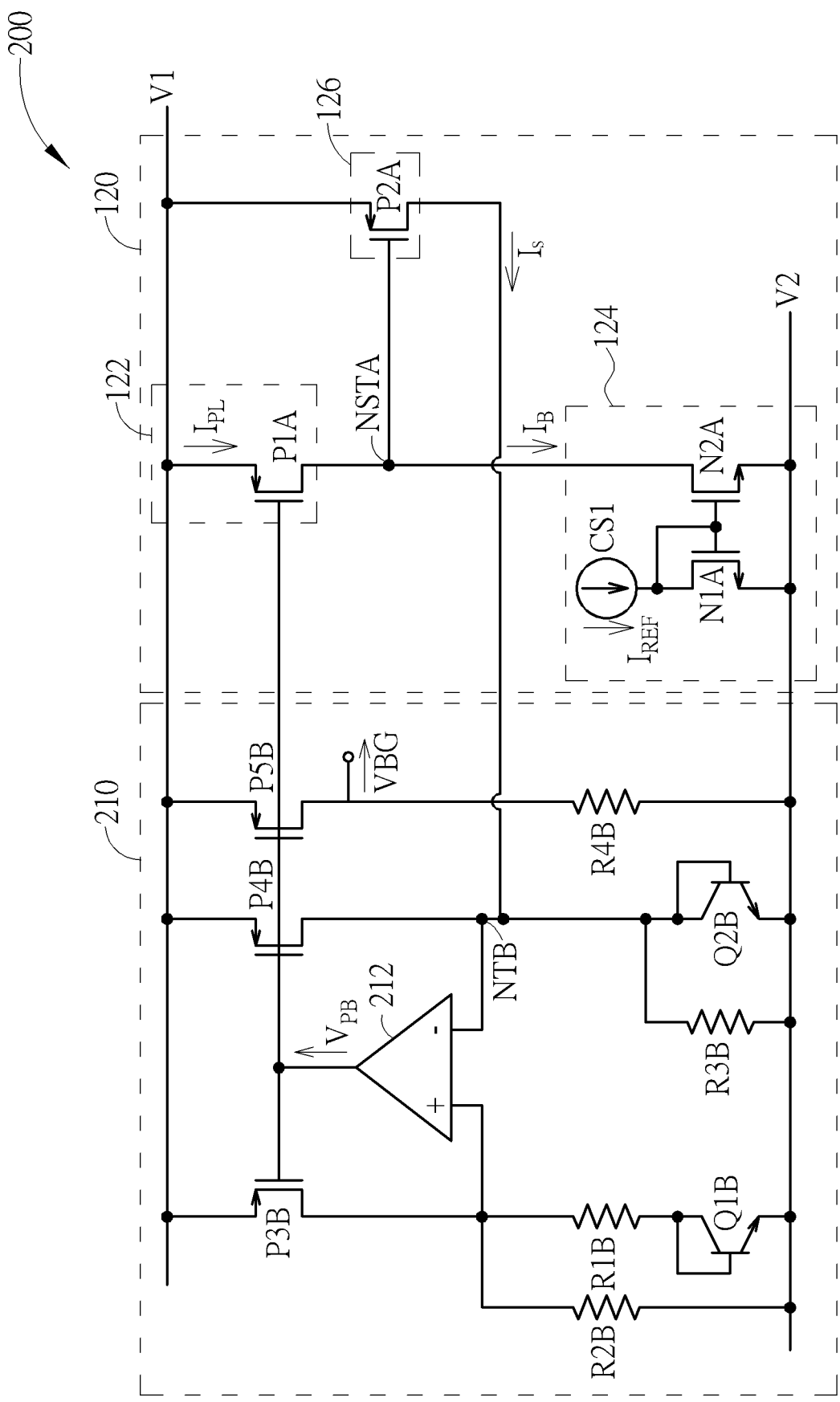
FIG. 2 shows a voltage reference generator according to another embodiment of the present invention.

FIG. 2 shows a voltage reference generator 200 according to another embodiment of the present invention. The voltage reference generator 200 includes a band-gap voltage reference circuit 210 and the band-gap reference start-up circuit 120.

The band-gap voltage reference circuit 210 includes an amplifier 212, P-type transistors P3B, P4B, and P5B, resistors R1B, R2B, R3B, and R4B, and diode-connected BJTs Q1B and Q2B.

The amplifier 212 has a positive input terminal, a negative input terminal coupled to the trigger terminal NTB of the band-gap voltage reference circuit 210, and an output terminal for providing the biasing reference voltage $V_{PB}$. The P-type transistor P3B has a first terminal for receiving the first system voltage V1, a second terminal coupled to the positive input terminal of the amplifier 212, and a control terminal coupled to the output terminal of the amplifier 212. The P-type transistor P4B has a first terminal for receiving the first system voltage V1, a second terminal coupled to the negative input terminal of the amplifier 212, and a control terminal coupled to the control terminal of the P-type transistor P3B.

The resistor R1B has a first terminal coupled to the second terminal of the P-type transistor P3B, and a second terminal. The resistor R2B has a first terminal coupled to the second terminal of the P-type transistor P3B, and a second terminal for receiving the second system voltage V2. The resistor R3B has a first terminal coupled to the second terminal of the P-type transistor P4B, and a second terminal for receiving the second system voltage V2.

The diode-connected BJT Q1B has a first terminal coupled to the second terminal of the resistor R1B, and a second terminal for receiving the second system voltage V2. The diode-connected BJT Q2B has a first terminal coupled to the trigger terminal NTB, and a second terminal for receiving the second system voltage V2.

The P-type transistor P5B has a first terminal for receiving the first system voltage V1, a second terminal for outputting the band-gap reference voltage VBG, and a control terminal coupled to the output terminal of the amplifier 212. The resistor R4B has a first terminal coupled to the second terminal of the P-type transistor P5B, and a second terminal for receiving the second system voltage V2.

In this case, by raising the voltage of the trigger terminal NTB of the band-gap voltage reference circuit 210, the band-gap reference start-up circuit 120 can enable the band-gap voltage reference circuit 210 when power up. Also, once the band-gap voltage reference circuit 210 is enabled, the biasing reference voltage $V_{PB}$ generated by the amplifier 212 will drop, thereby enabling the pull-up unit 122 for stopping the start-up process. Consequently, the band-gap voltage reference circuit 210 can be controlled by currents so that the noise margin for start-up can be broadened. Also, the overshoot of the band-gap reference voltage VBG generated by the band-gap voltage reference circuit 210 can be reduced by triggering through the negative input terminal of the amplifier 212.

Furthermore, in FIG. 2, the diode-connected BJTs Q1B and Q2B are NPN BJTs. In this case, the control terminal of the diode-connected BJT Q1B can be coupled to the first terminal of the diode-connected BJT Q1B, and the control terminal of the diode-connected BJT Q2B can be coupled to the first terminal of the diode-connected BJT Q2B. However, in some other embodiments, the diode-connected BJTs Q1B and Q2B can be PNP BJTs, and the control terminals of the diode-connected BJTs Q1B and Q2B can receive the second system voltage V2 as the diode-connected BJTs Q1A and Q2A shown in FIG. 1.

Figure 3:
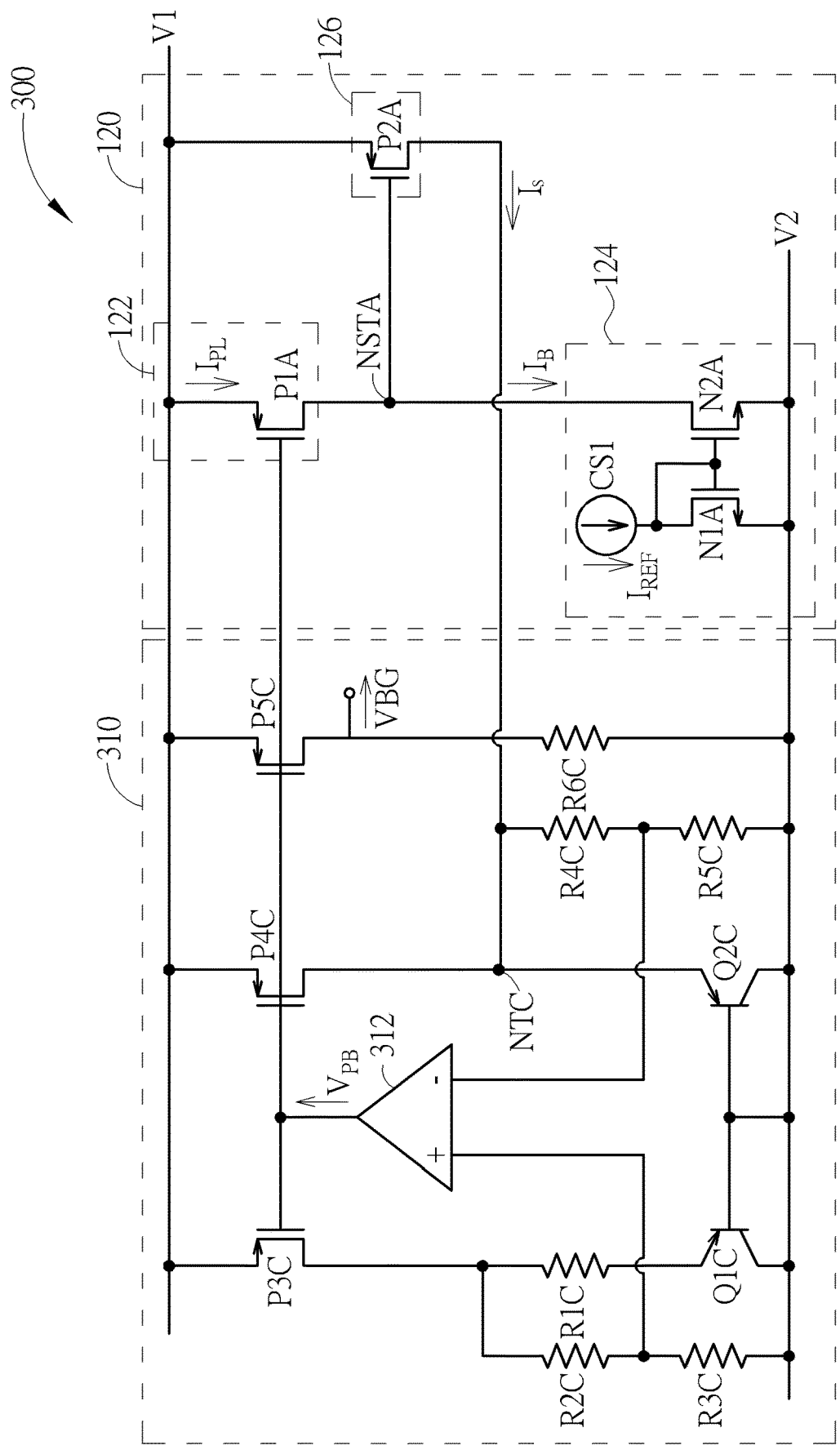
FIG. 3 shows a voltage reference generator according to another embodiment of the present invention.

FIG. 3 shows a voltage reference generator 300 according to another embodiment of the present invention. The voltage reference generator 300 includes a band-gap voltage reference circuit 310 and the band-gap reference start-up circuit 120.

The band-gap voltage reference circuit 310 includes an amplifier 312, P-type transistors P3C, P4C, and P5C, resistors R1C, R2C, R3C, R4C, R5C, and R6C, and diode-connected BJTs Q1C and Q2C.

The amplifier 312 has a positive input terminal, a negative input terminal, and an output terminal for providing the biasing reference voltage VPB. The P-type transistor P3C has a first terminal for receiving the first system voltage V1, a second terminal, and a control terminal coupled to the output terminal of the amplifier 312. The P-type transistor P4C has a first terminal for receiving the first system voltage V1, a second terminal coupled to the trigger terminal NTC of the band-gap voltage reference circuit 310, and a control terminal coupled to the control terminal of the P-type transistor P3C.

The resistor R1C has a first terminal coupled to the second terminal of the P-type transistor P3C, and a second terminal. The resistor R2C has a first terminal coupled to the second terminal of the P-type transistor P3C, and a second terminal coupled to the positive input terminal of the amplifier 312. The resistor R3C has a first terminal coupled to the second terminal of the resistor R2C, and a second terminal for receiving the second system voltage V2. The diode-connected BJT Q1C has a first terminal coupled to the second terminal of the resistor R1C, and a second terminal for receiving the second system voltage V2.

The resistor R4C has a first terminal coupled to the second terminal of the P-type transistor P4C, and a second terminal coupled to the negative input terminal of the amplifier 312. The resistor R5C has a first terminal coupled to the second terminal of the resistor R4C, and a second terminal for receiving the second system voltage V2. The diode-connected BJT Q2C has a first terminal coupled to the trigger terminal NTC, and a second terminal for receiving the second system voltage V2.

The P-type transistor P5C has a first terminal for receiving the first system voltage V1, a second terminal for outputting the band-gap reference voltage VBG, and a control terminal coupled to the output terminal of the amplifier 312. The resistor R6C has a first terminal coupled to the second terminal of the P-type transistor P5C, and a second terminal for receiving the second system voltage V2.

In this case, by raising the voltage of the trigger terminal NTC of the band-gap voltage reference circuit 310, the band-gap reference start-up circuit 120 can enable the band-gap voltage reference circuit 310 when power up. Also, once the band-gap voltage reference circuit 310 is enabled, the biasing reference voltage VPB generated by the amplifier 312 will drop, thereby enabling the pull-up unit 122 for stopping the start-up process. Consequently, the band-gap voltage reference circuit 310 can be controlled by currents so that the noise margin for start-up can be broadened. Also, the overshoot of the band-gap reference voltage VBG generated by the band-gap voltage reference circuit 310 can be reduced by triggering through the negative input terminal of the amplifier 312.

Figure 4:
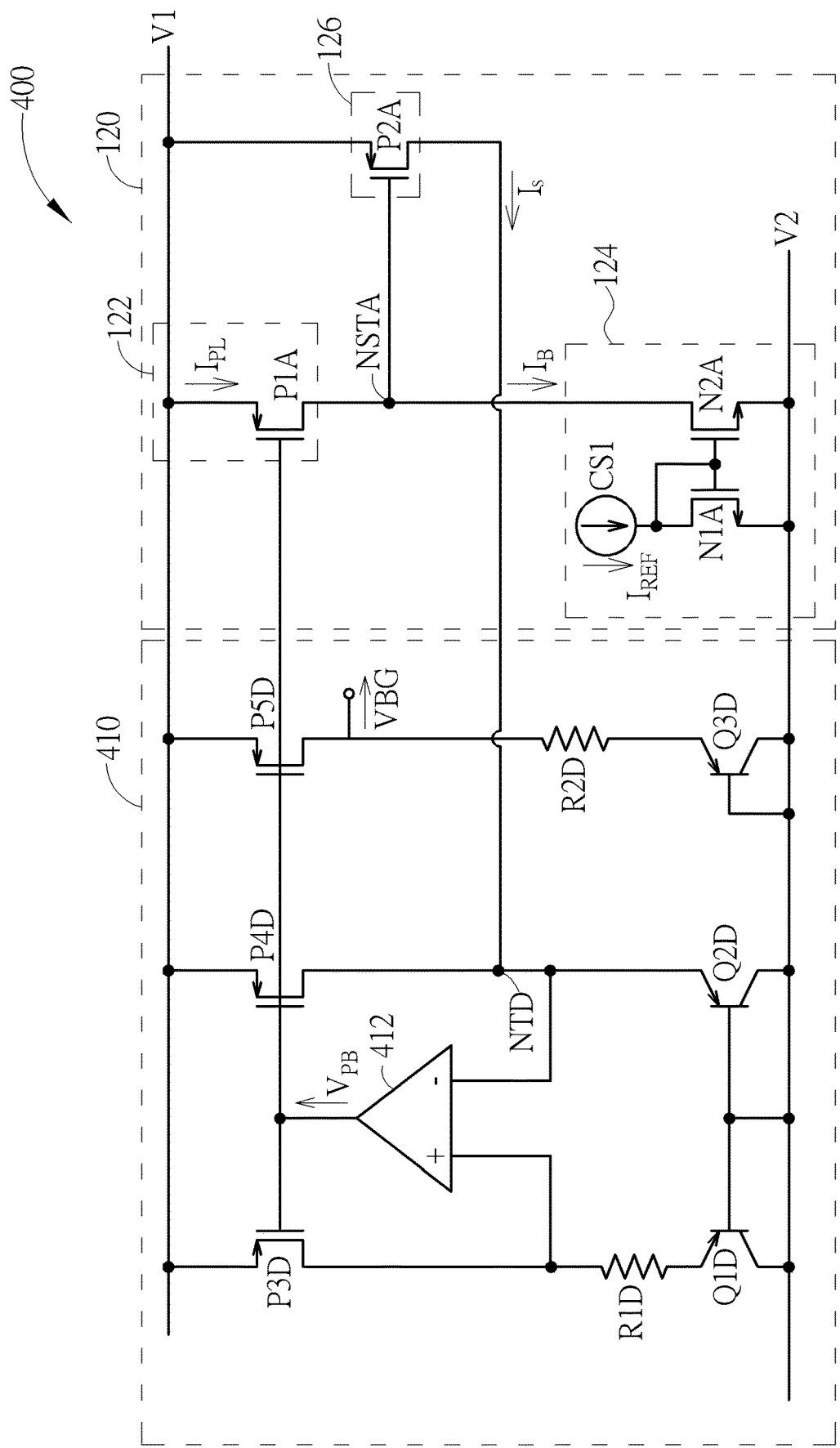
FIG. 4 shows a voltage reference generator according to another embodiment of the present invention.

FIG. 4 shows a voltage reference generator 400 according to another embodiment of the present invention. The voltage reference generator 400 includes a band-gap voltage reference circuit 410 and the band-gap reference start-up circuit 120.

The band-gap voltage reference circuit 410 includes an amplifier 412, P-type transistors P3D, P4D, and P5D, resistors R1D and R2D, and diode-connected BJTs Q1D, Q2D and Q3D.

The amplifier 412 has a positive input terminal, a negative input terminal coupled to the trigger terminal NTD of the band-gap voltage reference circuit 410, and an output terminal for providing the biasing reference voltage $V_{PB}$. The P-type transistor P3D has a first terminal for receiving the first system voltage V1, a second terminal coupled to the positive input terminal of the amplifier 412, and a control terminal coupled to the output terminal of the amplifier 412. The P-type transistor P4D has a first terminal for receiving the first system voltage V1, a second terminal coupled to the negative input terminal of the amplifier 412, and a control terminal coupled to the control terminal of the P-type transistor P3D.

The resistor R1D has a first terminal coupled to the second terminal of the P-type transistor P3D, and a second terminal. The diode-connected BJT Q1D has a first terminal coupled to the second terminal of the resistor R1D, and a second terminal for receiving the second system voltage V2. The diode-connected BJT Q2D has a first terminal coupled to the trigger terminal NTD, and a second terminal for receiving the second system voltage V2.

The P-type transistor P5D has a first terminal for receiving the first system voltage V1, a second terminal for outputting the band-gap reference voltage VBG, and a control terminal coupled to the output terminal of the amplifier 412. The resistor R2D has a first terminal coupled to the second terminal of the P-type transistor P5D, and a second terminal. The diode-connected BJT Q3D has a first terminal coupled to the second terminal of the resistor R2D, and a second terminal for receiving the second system voltage V2.

In this case, by raising the voltage of the trigger terminal NTD of the band-gap voltage reference circuit 410, the band-gap reference start-up circuit 120 can enable the band-gap voltage reference circuit 410 when power up. Also, once the band-gap voltage reference circuit 410 is enabled, the biasing reference voltage $V_{PB}$ generated by the amplifier 412 will drop, thereby enabling the pull-up unit 122 for stopping the start-up process. Consequently, the band-gap voltage reference circuit 410 can be controlled by currents so that the noise margin for start-up can be broadened. Also, the overshoot of the band-gap reference voltage VBG generated by the band-gap voltage reference circuit 410 can be reduced by triggering through the negative input terminal of the amplifier 412.

In FIGS. 1 to 4, the band-gap reference start-up circuit 120 can be used with the band-gap voltage reference circuits 110, 210, 310, and 410 to perform the start-up processes. Furthermore, in some embodiments, the band-gap reference start-up circuit 120 can also be used to perform the start-up processes for other types of band-gap voltage reference circuits to provide a greater noise margin and a smaller start-up transient.

In summary, the band-gap reference start-up circuits and the voltage reference generators provided by the embodiments of the present invention can perform the start-up process with current control, thereby increasing the noise margin and decreasing the start-up transient.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A band-gap reference start-up circuit comprising:
a pull-up unit coupled to a control node, and configured to generate a pull-up current for raising a voltage of the control node when a band-gap voltage reference circuit is enabled and generates a biasing reference voltage;
a bias current unit coupled to the control node, and configured to generate a bias current for pulling down the voltage of the control node; and
a start-up unit coupled to a trigger terminal of the band-gap voltage reference circuit and the control node, and configured to generate a start-up current for raising a voltage of the trigger terminal;
wherein during a start-up process of the band-gap voltage reference circuit:
the start-up unit is enabled when the voltage of the control node is pulled down by the bias current unit; and
the band-gap voltage reference circuit is enabled when the voltage of the trigger terminal is raised by the start-up current.

2. The band-gap reference start-up circuit of claim 1, wherein the pull-up current is greater than the bias current.

3. The band-gap reference start-up circuit of claim 1, wherein the pull-up unit comprises:
a first P-type transistor having a first terminal configured to receive a first system voltage, a second terminal coupled to the control node, and a control terminal configured to receive the biasing reference voltage.

4. The band-gap reference start-up circuit of claim 1, wherein the bias current unit comprises:
a current source configured to generate a reference current;
a first N-type transistor having a first terminal configured to receive the reference current, a second terminal configured to receive a second system voltage lower than the first system voltage, and a control terminal coupled to the first terminal of the first N-type transistor; and
a second N-type transistor having a first terminal coupled to the control node, a second terminal configured to receive the second system voltage, and a control terminal coupled to the control terminal of the first N-type transistor.

5. The band-gap reference start-up circuit of claim 1, wherein the start-up unit comprises:
a second P-type transistor having a first terminal configured to receive a first system voltage, a second terminal coupled to the trigger terminal of the band-gap voltage reference circuit, and a control terminal coupled to the control node.

6. A voltage reference generator comprising:
a band-gap voltage reference circuit configured to provide a band-gap reference voltage; and
a band-gap reference start-up circuit comprising:
a pull-up unit coupled to a control node, and configured to generate a pull-up current for raising a voltage of the control node when the band-gap voltage reference circuit is enabled and generates a biasing reference voltage;
a bias current unit coupled to the control node, and configured to generate a bias current for pulling down the voltage of the control node; and a start-up unit coupled to a trigger terminal of the band-gap voltage reference circuit and the control node, and configured to generate a start-up current for raising a voltage of the trigger terminal;

wherein during a start-up process of the band-gap voltage reference circuit:

the start-up unit is enabled when the voltage of the control node is pulled down by the bias current unit; and the band-gap voltage reference circuit is enabled when the voltage of the trigger terminal is raised by the start-up current.

7. The voltage reference generator of claim 6, wherein the pull-up current is greater than the bias current.

8. The voltage reference generator of claim 6, wherein the pull-up unit comprises:

a first P-type transistor having a first terminal configured to receive a first system voltage, a second terminal coupled to the control node, and a control terminal configured to receive the biasing reference voltage.

9. The voltage reference generator of claim 6, wherein the bias current unit comprises:

a current source configured to generate a reference current;

a first N-type transistor having a first terminal configured to receive the reference current, a second terminal configured to receive a second system voltage lower than the first system voltage, and a control terminal coupled to the first terminal of the first N-type transistor; and a second N-type transistor having a first terminal coupled to the control node, a second terminal configured to receive the second system voltage, and a control terminal coupled to the control terminal of the first N-type transistor.

10. The voltage reference generator of claim 6, wherein the start-up unit comprises:

a second P-type transistor having a first terminal configured to receive a first system voltage, a second terminal coupled to the trigger terminal of the band-gap voltage reference circuit, and a control terminal coupled to the control node.

11. The voltage reference generator of claim 6, wherein the band-gap voltage reference circuit comprises:

an amplifier having a positive input, a negative input coupled to the trigger terminal of the band-gap voltage reference circuit, and an output terminal configured to provide the biasing reference voltage;

a third P-type transistor having a first terminal configured to receive a first system voltage, a second terminal, and a control terminal coupled to the output terminal of the amplifier;

a fourth P-type transistor having a first terminal configured to receive the first system voltage, a second terminal configured to output the band-gap reference voltage, and a control terminal coupled to the control terminal of the third P-type transistor;

a first resistor having a first terminal coupled to the second terminal of the third P-type transistor, and a second terminal coupled to the positive input terminal of the amplifier;

a second resistor having a first terminal coupled to the second terminal of the fourth P-type transistor, and a second terminal coupled to the negative input terminal of the amplifier;

a third resistor having a first terminal coupled to the second terminal of the first resistor, and a second terminal;

a first diode-connected bipolar junction transistor having a first terminal coupled to the second terminal of the third resistor, and a second terminal configured to receive a second system voltage lower than the first system voltage; and a second diode-connected bipolar junction transistor having a first terminal coupled to the trigger terminal, and a second terminal configured to receive the second system voltage.

12. The voltage reference generator of claim 11, wherein:

the first diode-connected bipolar junction transistor and the second diode-connected bipolar junction transistor are PNP bipolar junction transistors;

a control terminal of the first diode-connected bipolar junction transistor is configured to receive the second system voltage; and a control terminal of the second diode-connected bipolar junction transistor is configured to receive the second system voltage.

13. The voltage reference generator of claim 11, wherein:

the first diode-connected bipolar junction transistor and the second diode-connected bipolar junction transistor are NPN bipolar junction transistors;

a control terminal of the first diode-connected bipolar junction transistor is coupled to the first terminal of the first diode-connected bipolar junction transistor; and a control terminal of the second diode-connected bipolar junction transistor is coupled to the first terminal of the second diode-connected bipolar junction transistor.

14. The voltage reference generator of claim 11, wherein:

a size of the first diode-connected bipolar junction transistor is greater than a size of the second diode-connected bipolar junction transistor.

15. The voltage reference generator of claim 6, wherein the band-gap voltage reference circuit comprises:

an amplifier having a positive input, a negative input coupled to the trigger terminal of the band-gap voltage reference circuit, and an output terminal configured to provide the biasing reference voltage;

a third P-type transistor having a first terminal configured to receive a first system voltage, a second terminal coupled to the positive input terminal of the amplifier, and a control terminal coupled to the output terminal of the amplifier;

a fourth P-type transistor having a first terminal configured to receive the first system voltage, a second terminal coupled to the negative input terminal of the amplifier, and a control terminal coupled to the control terminal of the third P-type transistor;

a first resistor having a first terminal coupled to the second terminal of the third P-type transistor, and a second terminal;

a second resistor having a first terminal coupled to the second terminal of the third P-type transistor, and a second terminal configured to receive a second system voltage lower than the first system voltage;

a third resistor having a first terminal coupled to the second terminal of the fourth P-type transistor, and a second terminal configured to receive the second system voltage;

a first diode-connected bipolar junction transistor having a first terminal coupled to the second terminal of the first resistor, and a second terminal configured to receive the second system voltage;

a second diode-connected bipolar junction transistor having a first terminal coupled to the trigger terminal, and a second terminal configured to receive the second system voltage;

a fifth P-type transistor having a first terminal configured to receive the first system voltage, a second terminal configured to output the band-gap reference voltage, and a control terminal coupled to the output terminal of the amplifier; and a fourth resistor having a first terminal coupled to the second terminal of the fifth P-type transistor, and a second terminal configured to receive the second system voltage.

16. The voltage reference generator of claim 15, wherein:
the first diode-connected bipolar junction transistor and the second diode-connected bipolar junction transistor are PNP bipolar junction transistors;
a control terminal of the first diode-connected bipolar junction transistor is configured to receive the second system voltage; and
a control terminal of the second diode-connected bipolar junction transistor is configured to receive the second system voltage.

17. The voltage reference generator of claim 15, wherein:
the first diode-connected bipolar junction transistor and the second diode-connected bipolar junction transistor are NPN bipolar junction transistors;
a control terminal of the first diode-connected bipolar junction transistor is coupled to the first terminal of the first diode-connected bipolar junction transistor; and
a control terminal of the second diode-connected bipolar junction transistor is coupled to the first terminal of the second diode-connected bipolar junction transistor.

18. The voltage reference generator of claim 6, wherein the band-gap voltage reference circuit comprises:
an amplifier having a positive input, a negative input, and an output terminal configured to provide the biasing reference voltage;
a third P-type transistor having a first terminal configured to receive a first system voltage, a second terminal, and a control terminal coupled to the output terminal of the amplifier;
a fourth P-type transistor having a first terminal configured to receive the first system voltage, a second terminal coupled to the trigger terminal of the band-gap voltage reference circuit, and a control terminal coupled to the control terminal of the third P-type transistor;
a first resistor having a first terminal coupled to the second terminal of the third P-type transistor, and a second terminal;

a second resistor having a first terminal coupled to the second terminal of the third P-type transistor, and a second terminal coupled to the positive input terminal of the amplifier; and a third resistor having a first terminal coupled to the second terminal of the second resistor, and a second terminal configured to receive a second system voltage lower than the first system voltage;

a first diode-connected bipolar junction transistor having a first terminal coupled to the second terminal of the first resistor, and a second terminal configured to receive the second system voltage;

a fourth resistor having a first terminal coupled to the second terminal of the fourth P-type transistor, and a second terminal coupled to the negative input terminal of the amplifier;

a fifth resistor having a first terminal coupled to the second terminal of the fourth resistor, and a second terminal configured to receive the second system voltage;

a second diode-connected bipolar junction transistor having a first terminal coupled to the trigger terminal, and a second terminal configured to receive the second system voltage;

a fifth P-type transistor having a first terminal configured to receive the first system voltage, a second terminal configured to output the band-gap reference voltage, and a control terminal coupled to the output terminal of the amplifier; and a sixth resistor having a first terminal coupled to the second terminal of the fifth P-type transistor, and a second terminal configured to receive the second system voltage.

19. The voltage reference generator of claim 18, wherein:
the first diode-connected bipolar junction transistor and the second diode-connected bipolar junction transistor are PNP bipolar junction transistors;
a control terminal of the first diode-connected bipolar junction transistor is configured to receive the second system voltage; and
a control terminal of the second diode-connected bipolar junction transistor is configured to receive the second system voltage.

20. The voltage reference generator of claim 18, wherein:
the first diode-connected bipolar junction transistor and the second diode-connected bipolar junction transistor are NPN bipolar junction transistors;
a control terminal of the first diode-connected bipolar junction transistor is coupled to the first terminal of the first diode-connected bipolar junction transistor; and
a control terminal of the second diode-connected bipolar junction transistor is coupled to the first terminal of the second diode-connected bipolar junction transistor.

* * * * *